(12) United States Patent
Sell et al.

(10) Patent No.: US 6,788,724 B2
(45) Date of Patent: Sep. 7, 2004

(54) HERMETICALLY SEALED EXTERNAL CAVITY LASER SYSTEM AND METHOD

(75) Inventors: John E. Sell, San Jose, CA (US); Paul N. Ludwig, Livermore, CA (US); Victor M. Alvarez, Fremont, CA (US); Ronald L. Strijek, Gilroy, CA (US)

(73) Assignee: Intel Corporation, Santa Clara, CA (US)

(*) Notice: Subject to any disclaimer, the term of this patent is extended or adjusted under 35 U.S.C. 154(b) by 59 days.

(21) Appl. No.: 09/900,423

(22) Filed: Jul. 6, 2001

(65) Prior Publication Data

US 2003/0007539 A1 Jan. 9, 2003

(51) Int. Cl.[7] .............................. H01S 3/08; H01S 3/04
(52) U.S. Cl. ............................................ 372/92; 372/34
(58) Field of Search .............................. 372/92, 34–36, 372/18, 29, 20; 250/339, 13; 359/112; 385/92

(56) References Cited

U.S. PATENT DOCUMENTS

| | | |
|---|---|---|
| 3,788,743 A | 1/1974 | George |
| 3,899,748 A | 8/1975 | Bodlaj |
| 3,921,099 A | 11/1975 | Abrams et al. |
| 3,965,440 A | 6/1976 | Graves |
| 4,410,992 A | 10/1983 | Javan |
| 4,460,977 A | 7/1984 | Shimada et al. |
| 4,730,105 A | 3/1988 | Mitschke et al. |
| 4,847,854 A * | 7/1989 | Van Dijk ..................... 372/92 |
| 4,934,816 A | 6/1990 | Silver et al. |
| 5,022,745 A | 6/1991 | Zayhowski et al. |
| 5,124,993 A | 6/1992 | Braunlich et al. |
| 5,163,063 A | 11/1992 | Yoshikawa et al. |
| 5,181,214 A * | 1/1993 | Berger et al. ................ 372/34 |
| 5,289,491 A | 2/1994 | Dixon |
| 5,319,668 A | 6/1994 | Luecke ..................... 372/107 |
| 5,412,676 A | 5/1995 | Schnier et al. |
| 5,414,280 A | 5/1995 | Girmay |
| 5,418,800 A | 5/1995 | Prior et al. |
| 5,428,700 A | 6/1995 | Hall |
| 5,444,724 A | 8/1995 | Goto |
| 5,497,937 A * | 3/1996 | Yoshikawa et al. .......... 228/205 |
| 5,530,714 A | 6/1996 | Vilhelmsson et al. ......... 372/92 |
| 5,673,129 A | 9/1997 | Mizrahi |
| 5,721,430 A * | 2/1998 | Wong .................... 250/339.13 |

(List continued on next page.)

FOREIGN PATENT DOCUMENTS

| | | |
|---|---|---|
| EP | 1 069 659 A1 | 1/2001 |
| EP | 1 087 477 A2 | 3/2001 |
| WO | WO 98/05105 | 2/1998 |
| WO | WO 00/49689 | 8/2000 |
| WO | WO 01/04999 A1 | 1/2001 |
| WO | WO 02/078137 A1 | 10/2002 |
| WO | WO 03/005500 A2 | 1/2003 |
| WO | WO 03/005501 A2 | 1/2003 |
| WO | WO 03/005512 A2 | 1/2003 |
| WO | PCT/US 02/21409 | 11/2003 |

OTHER PUBLICATIONS

Ketelsen, L. J. P., "Simple Technique for Measuring Cavity Loss in Semiconductor Laser," *Electronics Letters,* (Aug. 18, 1994), vol. 30, No. 17, pp. 1422–1424.

Shtengel, G. E., et al., "Internal Optical Loss Measurements in 1.3 $\mu$m InGaAsP Lasers," *Electronic Letters,* (Jul. 6, 1995), vol. 31, No. 14, pp. 1157–1159.

*Primary Examiner*—Don Wong
*Assistant Examiner*—Hung Tran Vy
(74) *Attorney, Agent, or Firm*—Blakely, Sokoloff, Taylor & Zafman LLP

(57) ABSTRACT

An external cavity laser in a hermetically sealed container and methods for hermetically sealing the external cavity laser. The external cavity laser may be tunable by various mechanisms to allow transmission at multiple selectable wavelength channels.

32 Claims, 7 Drawing Sheets

U.S. PATENT DOCUMENTS

| | | | |
|---|---|---|---|
| 5,751,750 A | | 5/1998 | Friede et al. |
| 5,777,773 A | | 7/1998 | Epworth et al. |
| 5,812,716 A | * | 9/1998 | Ohishi ........................ 385/92 |
| 5,848,092 A | | 12/1998 | Mitsumoto et al. |
| 5,872,881 A | * | 2/1999 | Rossi et al. .................... 385/92 |
| 5,917,188 A | * | 6/1999 | Atkinson et al. ...... 250/339.13 |
| 5,943,352 A | | 8/1999 | Fee |
| 6,004,477 A | * | 12/1999 | Nakagawa et al. .... 252/188.28 |
| 6,018,535 A | | 1/2000 | Maeda |
| 6,034,799 A | | 3/2000 | Hansen |
| 6,040,950 A | | 3/2000 | Broome |
| 6,044,095 A | | 3/2000 | Asano et al. |
| 6,064,501 A | | 5/2000 | Roberts et al. |
| 6,081,539 A | | 6/2000 | Mattori et al. |
| 6,108,355 A | * | 8/2000 | Zorabedian .................. 372/20 |
| 6,115,121 A | | 9/2000 | Erskine |
| 6,151,337 A | | 11/2000 | Carlsten et al. |
| 6,165,816 A | * | 12/2000 | Mizushima et al. ........ 438/118 |
| 6,181,717 B1 | | 1/2001 | Kner et al. |
| 6,201,638 B1 | | 3/2001 | Hall et al. |
| 6,205,159 B1 | | 3/2001 | Sesko et al. |
| 6,215,802 B1 | | 4/2001 | Lunt |
| 6,220,767 B1 | | 4/2001 | Bookbinder ................ 385/94 |
| 6,229,835 B1 | | 5/2001 | Tomaru et al. |
| 6,249,365 B1 | | 6/2001 | Mizrahi et al. |
| 6,259,712 B1 | | 7/2001 | DeCain et al. |
| 6,263,004 B1 | | 7/2001 | Arvidsson et al. |
| 6,282,222 B1 | * | 8/2001 | Wieser et al. .................. 372/74 |
| 6,301,280 B1 | | 10/2001 | Broutin et al. |
| 6,304,586 B1 | | 10/2001 | Pease et al. |
| 6,337,660 B1 | | 1/2002 | Esman et al. |
| 6,366,592 B1 | * | 4/2002 | Flanders ...................... 372/18 |
| 6,366,689 B1 | | 4/2002 | Rao et al. |
| 6,404,538 B1 | | 6/2002 | Chen et al. |
| 6,441,933 B1 | | 8/2002 | Jang |
| 6,455,930 B1 | * | 9/2002 | Palanisamy et al. ........ 257/706 |
| 6,470,036 B1 | | 10/2002 | Bailey et al. |
| 6,516,010 B1 | * | 2/2003 | Broutin et al. ........... 372/29.01 |
| 6,532,091 B1 | | 3/2003 | Miyazaki et al. |
| 6,663,294 B2 | * | 12/2003 | Crane et al. .................. 385/92 |
| 2001/0028670 A1 | * | 10/2001 | Tamura et al. ................ 372/55 |
| 2002/0018627 A1 | * | 2/2002 | Kato et al. .................... 385/93 |
| 2002/0048297 A1 | * | 4/2002 | Irie et al. ...................... 372/36 |
| 2002/0070663 A1 | * | 6/2002 | Ogura et al. ................ 313/506 |
| 2002/0126345 A1 | * | 9/2002 | Green et al. ................ 359/122 |

\* cited by examiner

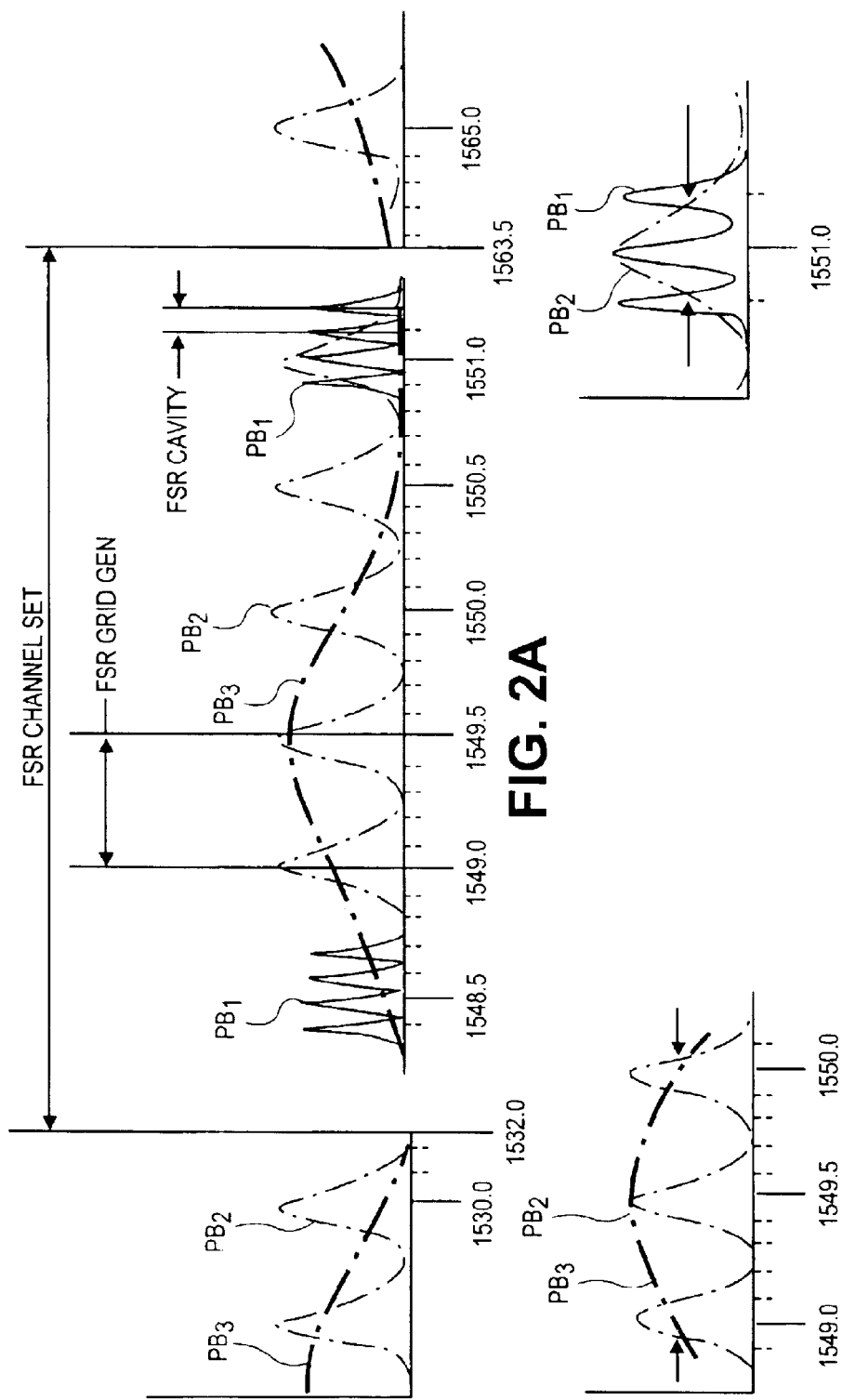

HERMETICALLY SEALED EXTERNAL CAVITY LASER SYSTEM AND METHOD

BACKGROUND OF THE INVENTION

Fiberoptic telecommunications are continually subject to demand for increased bandwidth. One way that bandwidth expansion has been accomplished is through dense wavelength division multiplexing (DWDM) wherein multiple separate data streams exist concurrently in a single optical fiber, with modulation of each data stream occurring on a different channel. Each data stream is modulated onto the output beam of a corresponding semiconductor transmitter laser operating at a specific channel wavelength, and the modulated outputs from the semiconductor lasers are combined onto a single fiber for transmission in their respective channels. The International Telecommunications Union (ITU) presently requires channel separations of approximately 0.4 nanometers, or about 50 GHz. This channel separation allows up to 128 channels to be carried by a single fiber within the bandwidth range of currently available fibers and fiber amplifiers. Improvements in fiber technology together with the ever-increasing demand for greater bandwidth will likely result in smaller channel separation in the future.

Transmitter lasers used in DWDM systems have typically been based on distributed feedback (DFB) lasers operating with a reference etalon associated in a feedback control loop, with the reference etalon defining the ITU wavelength grid. Statistical variation associated with the manufacture of individual DFB lasers results in a distribution of channel center wavelengths across the wavelength grid, and thus individual DFB transmitters are usable only for a single channel or a small number of adjacent channels. Continuously tunable external cavity lasers have been developed to overcome this problem.

The advent of continuously tunable telecommunication lasers has introduced additional complexity to telecommunication transmission systems. Particularly, the tuning aspects of such lasers involve multiple optical surfaces that are sensitive to contamination and degradation during use. Heretofore, no systems have been available which provide adequate protection for continuously tunable telecommunication lasers. This lack has resulted in increased costs and decreased performance lifetimes for such lasers.

SUMMARY OF THE INVENTION

The invention provides a telecommunication laser apparatus in hermetically sealed containers and laser methods using hermetically sealed laser systems. In its most general terms, the apparatus of the invention comprises an external cavity laser, and a hermetically sealable container configured to enclose the external cavity laser in an inert atmosphere. The external cavity laser may be tunable by various mechanisms to allow transmission at multiple selectable wavelength channels.

The external cavity laser may comprise a gain medium and an end mirror. The gain medium may comprise a diode emitter chip including first and second output facets, with an anti-reflective coating on the second output facet. The first output facet and the end mirror define an external cavity, with the gain medium emitting a coherent beam from the second output facet along an optical path in the external cavity to the end mirror. A channel selector or like tunable element may be positioned within the external cavity in the optical path between the end mirror and the emitter chip.

The hermetically sealable container encloses the external cavity laser, including the end mirror, gain medium, and tuning element. Hermetically sealing the external cavity laser under an inert atmosphere protects the anti-reflective (AR) coating on the gain medium, as well as surfaces on the channel selector and other optical components. The deposition of contaminants onto the optical surfaces of components associated with an external cavity laser, which may occur in the absence of hermetic sealing, causes aberrations which hinder the performance of the external laser cavity and promote degradation of critical optical surfaces. Hermetically sealing the external cavity laser as provided by the invention allows for a controlled environment that prevents corrosion and contamination of the optical surfaces of the laser.

Tunable external cavity lasers usable with the invention may also comprise a grid generator, a tuning assembly configured to adjust the end mirror and the channel selector, and various other components involved in tuning and laser operation. Many of these components can have high outgassing characteristics during laser operation such that volatile hydrocarbons can contaminate and/or cause degradation of various optical surfaces of the external cavity laser. In this regard, the external cavity laser is configured to minimize or eliminate problems associated with outgassing by lubricants, adhesives, cable insulators and other components which contain volatile compounds and residual moisture by careful material selection and minimizing the use of potentially outgassing materials.

In certain embodiments, one or more activated carbon drains are sealed within the hermetically sealed enclosure and positioned to collect volatile hydrocarbons produced by outgassing from components of the external cavity laser. The activated carbon drain has a large surface area of activated carbon that allows for adsorbing or trapping the outgassing volatile organic compounds that occur during the operation of the laser. Organic hydrocarbon materials released from epoxies and lubricants used during the assembly of the external cavity laser or utilized in sealing the hermetically sealable enclosure are also trapped by the activated carbon drain. The activated carbon drain allows the optical surfaces of the tunable external cavity laser to remain free of organic contaminants in the hermetically sealed enclosure that would otherwise hinder performance.

In other embodiments, one or more moisture traps may be included within the hermetically sealable container and positioned to collect water vapor that may outgas from polyimide or other moisture holding insulator or material present in the external cavity laser. Such outgassed water vapor, if not trapped, may condense on critical optical surfaces and reduce performance of the external cavity laser, and may promote corrosion of components. Moisture condensation is particularly a concern after "cool-down" periods when the laser has not been in use. The material of the moisture trap may comprise a variety of desiccants. The moisture trap prevents condensation of water on optical surfaces and elsewhere that would otherwise reduce performance in the operation of the external cavity laser and promote corrosion of laser components within the hermetically sealed enclosure.

In one embodiment, the inert atmosphere sealed within the hermetically sealed container comprises nitrogen. Other inert gases may also be enclosed in the hermetically sealed enclosure such as helium, argon, krypton, xenon, or various mixtures thereof, including a nitrogen-helium mix, a neon-helium mix, a krypton-helium mix, or a xenon-helium mix. Helium may be added to the inert atmosphere to allow for testing and monitoring the level of hermeticity of the sealed container. The inert gas or gas mix included within the hermetically sealed container may be selected for a particular refractive index or other optical property.

The apparatus of the invention may also comprise a sacrificial surface located within the hermetically sealed enclosure in which both condensation and volatile hydrocarbons from outgassing are trapped upon to avoid contamination of the optical services of the tunable external cavity laser. The sacrificial surface is configured to remain cooler than surrounding surfaces during laser operation, and may be actively cooled by a cooling source and/or be made of material which provides passive cooling by acting as a heat sink which will attract volatile hydrocarbons and water vapor.

In certain embodiments, selective heating of important optical surfaces may be employed to prevent condensation of contaminants thereon. Such heating may be employed during cool-down periods when the gain medium is not powered, to prevent condensation when the external cavity laser is not in use. One or more heat sources, either positioned internally or externally to the hermetically sealed enclosure, may be used to heat the gain medium of the external cavity laser when the gain medium is not powered, in order to maintain a relatively high temperature for the anti-reflective coating on the output facet of the gain medium to prevent condensation thereon when the laser is not in use. Heating in this manner may also be used in connection with the end mirror, tunable elements or other components with sensitive optical surfaces to maintain a temperature higher than the activated carbon drain, moisture trap and/or the sacrificial surface present in the hermetically sealed container, to further prevent the contamination of these optical surfaces.

The invention may be embodied in a telecommunication laser system which comprises an optical fiber extending into the hermetic container through a hermetic fiberoptic feedthrough and optically coupled to an output facet of the external cavity laser to receive optical output therefrom. The hermetically sealable container may vary in configuration, but will generally be configured such that the optical fiber can be feed through a side of the hermetically sealable container. Various electrical leads necessary for operation of the external cavity laser, may extend into the hermetic container through hermetic feedthroughs in the sides of the hermetic enclosure.

BRIEF DESCRIPTIONS OF THE DRAWINGS

FIGS. 2A–2C are graphical illustrations of pass band characteristics of the external cavity laser with respect to FIG. 1 for the wedge etalon channel selector, grid generator etalon, and external cavity with respect to a selected channel in a wavelength grid.

DETAILED DESCRIPTION

Referring more specifically to the drawings, for illustrative purposes the present invention is embodied in the apparatus shown in FIG. 1 through FIG. 7. It will be appreciated that the apparatus may vary as to configuration and as to details of the parts, and that the method may vary as to details and the order of the acts, without departing from the basic concepts as disclosed herein. The invention is disclosed primarily in terms of a hermetically sealed external cavity diode laser (ECDL) package and a method of hermetically sealing the ECDL. However, it will be readily apparent to those skilled in the art that the invention may be used with other laser devices or optical systems. It also should be understood that the terminology used herein is for the purpose of describing particular embodiments only, and is not intended to be limiting.

Figure 1:
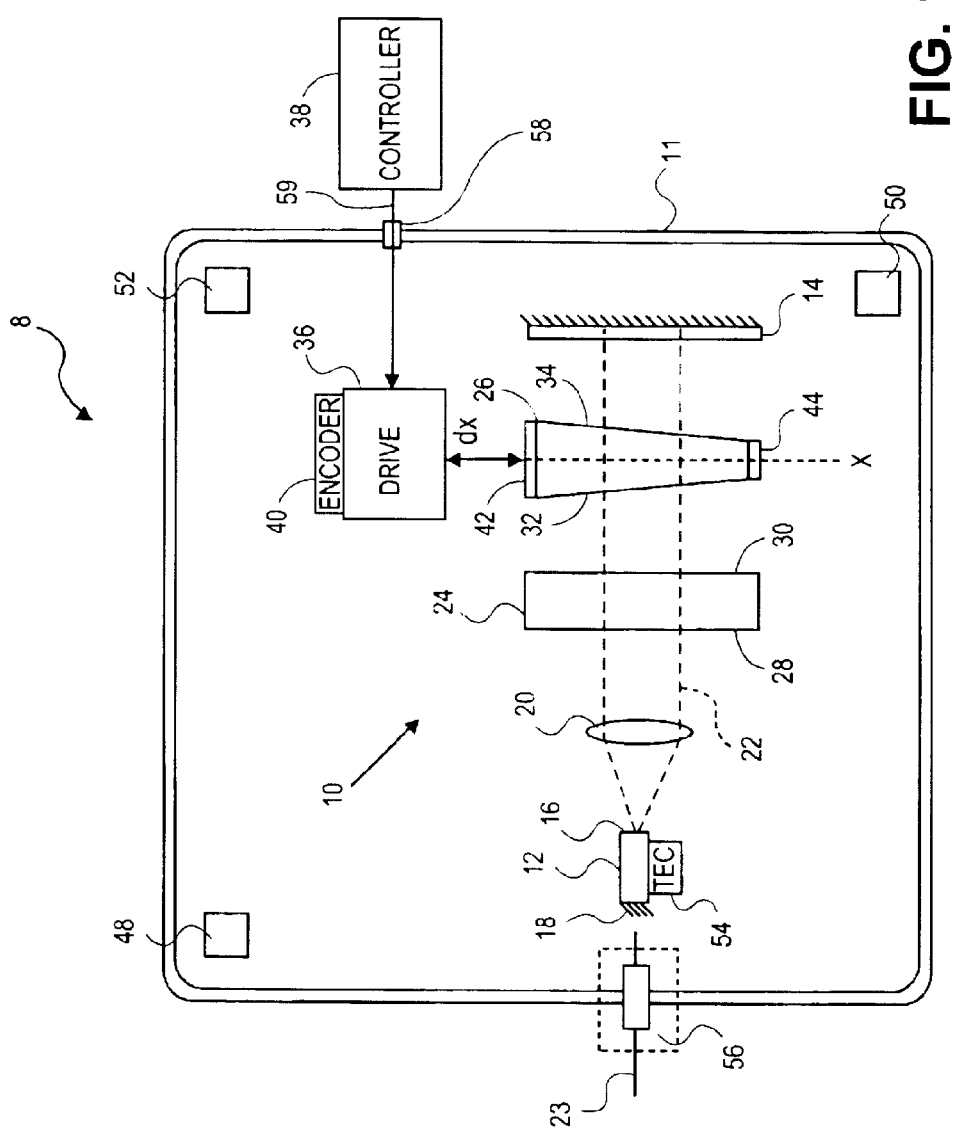
FIG. 1 is a schematic diagram of a hermetically sealed external cavity laser apparatus.

Referring now to FIG. 1, there is shown a telecommunication laser apparatus 8 comprising an external cavity laser 10 enclosed in a hermetically sealed container 11. The external cavity laser 10 includes a gain medium 12 and an end or external reflective element or end mirror 14. Gain medium 12 may comprise a conventional Fabry-Perot diode emitter chip that has an anti-reflection (AR) coated front facet 16 and a partially reflective rear facet 18. The external laser cavity is delineated by rear facet 18 and end mirror 14. Gain medium 12 emits a coherent beam from front facet 16 that is collimated by lens 20 to define an optical path 22 which is co-linear with the optical axis of the external cavity. Front and rear facets 16, 18 of gain medium 12 are aligned with the optical axis of the external cavity as well. Conventional output optics (not shown) are associated with rear facet 18 for coupling the output of external cavity laser 11 into an optical fiber 23. Container 11 includes a lid (not shown) which hermetically seals to container to enclose the external cavity laser 10 within container 11. The lid may be of generally flat, rectangular configuration such that it generally conforms to the shape of container 11. The lid may be plated or coated with an oxidation resistant metal or metal alloy such as Ni/Au that is configured to bond to container 11 by fusing, soldering or other hermetic sealing technique.

The external cavity laser 10 includes a grid generator element and a tunable element, which are respectively shown in FIG. 1 as a grid etalon 24 and a wedge etalon 26 positioned in optical path 22 between gain medium 12 and end mirror 14. Grid etalon 24 typically is positioned in optical path 22 before tunable element 26, and has parallel reflective faces 28, 30. Grid etalon 24 operates as an interference filter, and the refractive index of grid etalon 24 and the optical thickness of grid etalon 24 as defined by the spacing of faces 28, 30 give rise to a multiplicity of minima within the communication band at wavelengths which coincide with the center wavelengths of a selected wavelength grid which may comprise, for example, the ITU (International Telecommunications Union) grid. Other wavelength grids may alternatively be selected. Grid etalon has a free spectral range (FSR) which corresponds to the spacing between the grid lines of the ITU grid, and the grid etalon 24 thus operates to provide a plurality of pass bands centered on each of the gridlines of the wavelength grid. Grid etalon 24 has a finesse (free spectral range divided by full width half maximum or FWHM) which suppresses neighboring modes of the external cavity laser between each channel of the wavelength grid.

Grid etalon 24 may be a parallel plate solid, liquid or gas spaced etalon, and may be tuned by precise dimensioning of the optical thickness between faces 28, 30 by thermal expansion and contraction via temperature control. The grid etalon 24 may alternatively be tuned by tilting to vary the optical thickness between faces 28, 30, or by application of an electric field to an electrooptic etalon material. Grid etalon 24 may be thermally controlled to prevent variation in the selected grid which may arise due to thermal fluctuation during operation of external cavity laser 10. Grid etalon 34 alternatively may be actively tuned during laser operation as described in the U.S. patent application Ser. No. 09/900,474 entitled "External Cavity Laser with Continuous Tuning of Grid Generator" to inventors Qaiber et al., co-filed herewith, and incorporated herein by reference. Various other types of grid generator other than a grid etalon maybe used with external cavity laser 10.

Wedge etalon 26 also acts as an interference filter, with non-parallel reflective faces 32, 34 providing tapered shape. Wedge etalon 26 may comprise, for example, a tapered transparent substrate, a tapered air gap between the reflective surfaces of adjacent transparent substrates, or a thin film "wedge interference filter. Wedge etalon 26 as shown in FIG. 1 is only one tunable element or channel selector which may be used in accordance with the invention in an external cavity laser. Wedge etalon 26 may be replaced with a variety of tunable elements other than an etalon, such as grating devices and electro-optic devices. The use of an air gap wedge etalon as a channel selector is described in U.S. Pat. No. 6,108,355, wherein the "wedge" is a tapered air gap defined by adjacent substrates. The use of pivotally adjustable grating devices as channel selectors tuned by grating angle adjustment and the use of an electro-optic tunable channel selector in an external cavity laser and tuned by selective application of voltage are described in U.S. patent application Ser. No. 09/814,646 to inventor Andrew Daiber and filed on Mar. 21, 2001. The use of a translationally tuned graded thin film interference filter is described in U.S. patent application Ser. No. 09/814,646 and in U.S. patent application Ser. No. 09/900,412 entitled "Graded Thin Film Wedge Interference Filter and Method of Use for Laser Tuning" to inventors Hopkins et al., co-filed herewith. The aforementioned disclosures are incorporated herein by reference.

The relative size, shape and distances between the various optical components of external cavity laser 10 are in some instances exaggerated for clarity and are not necessarily shown to scale. External cavity laser 10 may include additional components (not shown), such as focusing and collimating components, and polarizing optics configured to remove spurious feedback associated with the various components of external cavity laser 10.

The pass bands defined by the wedge etalon 26 are substantially broader than the pass bands of the grid etalon 24, with the broader pass bands of the wedge etalon 26 a periodicity substantially corresponding to the separation between the shortest and longest wavelength channels defined by the grid etalon 24. In other words, the free spectral range of the wedge etalon 26 corresponds to the full wavelength range of the wavelength grid defined by grid etalon 24. The wedge etalon 26 has a finesse which suppresses channels adjacent to a particular selected channel.

The wedge etalon 26 is used to select between multiple communication channels by changing the optical thickness between faces 32, 34 of wedge etalon 26. This is achieved by translating or driving wedge etalon 26 along axis x, which is parallel to the direction of taper of wedge etalon 26 and perpendicular to optical path 22 and the optical axis of external cavity laser 11. Each of the pass bands defined by the wedge etalon 26 supports a selectable channel, and as the wedge is advanced or translated into optical path 22, the beam traveling along optical path 22 passes through increasingly thicker portions of wedge etalon 26 which support constructive interference between opposing faces 32, 34 at longer wavelength channels. As wedge etalon 26 is withdrawn from optical path 22, the beam will experience increasingly thinner portions of wedge etalon 26 and expose pass bands to the optical path 22 which support correspondingly shorter wavelength channels. The free spectral range of wedge etalon 26 corresponds to the complete wavelength range of grid etalon 24 as noted above, so that a single loss minimum within the communications band can be tuned across the wavelength grid. The combined feedback to gain medium 12 from the grid etalon 24 and wedge etalon 26 support lasing at the center wavelength of a selected channel. Across the tuning range, the free spectral range of the wedge etalon 26 is broader than that of grid etalon 24.

Wedge etalon 26 is positionally tuned via a tuning assembly which comprises a drive element 36 structured and configured to adjustably position wedge etalon 26 according to selected channels. Drive element 36 may comprise a stepper motor together with suitable hardware for precision translation of wedge etalon 26. Drive element may alternatively comprise various types of actuators, including, but not limited to, DC servomotors, solenoids, voice coil actuators, piezoelectric actuators, ultrasonic drivers, shape memory devices, and like linear actuators.

Drive element 36 is operatively coupled to a controller 38 which provides signals to control the positioning of wedge etalon 26 by drive element 36. Controller 38 may include a data processor and memory (not shown) wherein are stored lookup tables of positional information for wedge etalon 26 which correspond to selectable channel wavelengths. Controller 38 may be internal to driver element 36, or may be external and shared in other component positioning and servo functions of the external cavity laser 10. Controller as shown is external from hermetically sealed container 11, but may alternatively be internal to container 11.

When external cavity laser 10 is tuned to a different communication channel, controller 38 signals drive element 36 according to positional data in the look up table, and drive element 36 translates or drives wedge etalon 26 to the correct position wherein the optical thickness of the portion of the wedge etalon 26 positioned in optical path 22 provides constructive interference which supports the selected channel. A linear encoder 40 may be used in association with wedge etalon 26 and drive element 36 to ensure correct positioning of wedge etalon 26 by driver 36.

During tuning of wedge etalon 26, the length of the laser external cavity may also be tuned by positional adjustment of end mirror 14 using another tuning mechanism (not shown) which may comprise a DC servomotor, solenoid, voice coil actuator, piezoelectric actuator, ultrasonic driver, shape memory device, or other type of actuator. In certain embodiments, end mirror 14 may be positioned using selective heating or cooling of a compensating element coupled to the end mirror, as disclosed in U.S. patent application Ser. No. 09/900,443 entitled "Laser Apparatus with Active Thermal Tuning of External Cavity" to inventors Tuganov et al., filed concurrently herewith and incorporated herein by reference. The tuning of an external laser cavity with an electro-optic element according to error signals derived from voltage monitored across a gain medium is described in U.S. patent application Ser. No. 09/900,426 entitled "Evaluation and Adjustment of Laser Losses According to Voltage Across Gain Medium" to inventors Daiber et al., filed concurrently herewith and incorporated herein by reference.

Wedge etalon 26 may include opaque regions 42, 44 at its ends that are optically detectable and which serve to verify the position of wedge etalon 26 when it has been positionally tuned to its longest or shortest channel wavelength. Opaque regions 26 provide an additional encoder mechanism usable in the positional tuning of wedge etalon. When wedge 26 is moved into a position such that one of opaque regions 42, 44 enters optical path 22, the opaque region 42, 44 will block or attenuate the beam along optical path. This attenuation of light is detectable, as described further below. Since the location of opaque regions 42, 44 on wedge etalon 26 can be determined with precision, controller 38 can anticipate when an opaque region 42, 44 will enter optical path 22. Appearance of an opaque region 42, 4 in optical path 22 at a point other than predicted will indicate an encoder error, and the controller 38 can make an appropriate correction based on the detected presence of an opaque region 42, 44 in optical path 22. Additional opaque regions (not shown) may be included elsewhere on wedge etalon 26.

The optical surfaces of external cavity laser 10 within hermetic container 11 which are sensitive to contaminants, such as moisture and volatile organics or hydrocarbons, include, but are not limited to, the AR coated facet 16 of the gain medium 12, end mirror 14, the reflective faces 28, 30 of the grid etalon 24, the non-parallel reflective faces 32, 34 of the wedge etalon 26, and the surface of collimating lens 20. Other important optical surfaces of external cavity laser 10 that are not shown and which are contamination sensitive include polarizing and dichromic optical components and additional collimating components. Hermetically sealing the external cavity laser 10 within a hermetically sealable container 11 protects the external cavity laser 11 and other sensitive components by placing the telecommunication laser apparatus 10 in a controlled environment.

The laser apparatus 10 comprises at least one activated carbon drain 48 within hermetically sealed enclosure 11 for adsorbing or trapping volatile organics and hydrocarbons from outgassing of other components of external cavity laser 10 after sealing within enclosure 11. Activated carbon drain 48 has a large surface area of activated carbon configured to trap and retain volatile organic compounds which may be emitted from adhesives, lubricants, insulators or other organic material-containing components present within container 11 as described further below.

A moisture trap 50 is also provided within hermetically sealed container 11 to absorb moisture and prevent condensation of water vapor on the sensitive optical surfaces of the external cavity laser 10 after hermetically sealing within container 11. Water vapor may be emitted, for example from polyimide or other insulation material present in external cavity laser during operation within container 11. Moisture trap 50 may comprise a porous container of dried silica, calcium sulfate and/or other type of common dessicant.

The hermetically sealed enclosure 11 of the present invention may also comprise a sacrificial surface 52 on which both moisture condensation and volatile hydrocarbons from outgassing are trapped to avoid contamination of the optical services of the tunable external cavity laser 10. The sacrificial surface 52 may be cooled by an external cooling source and or be made of material or otherwise configured that can act as a heat sink which will selectively attract condensation of volatile organics and water vapor over surrounding or adjacent surfaces of higher temperature.

A heat source 54 may be used to heat gain medium 12 when gain medium 12 is not powered, in order to maintain an elevated temperature for the anti-reflective coating on the output facet 16 and prevent condensation thereon when external cavity laser 10 is not in use. As shown heat source 54 comprises a thermoelectric controller coupled to gain medium 12. Thermoelectric controller 54 may also be used during operation of gain medium 12 to thermally control the optical thickness across gain medium 12 between facets 16, 18. One or more additional heating elements (not shown) may be positioned internally or externally to the hermetically sealed enclosure 11 to maintain elevated temperatures for selected components to prevent condensation of contaminants thereon. Thus, heating may be used in connection with the end mirror 14 or channel selector 26 to maintain a temperature higher than the activated carbon drain 48, moisture trap 50 and/or the sacrificial surface 52, to prevent the contamination of optical surfaces 32, 34. The selective heating of critical optical components and optical surfaces in an external cavity laser is also described in U.S. patent application Ser. No. 09/900,429 entitled "External Cavity Laser with Selective Thermal Control" to inventors Daiber et al., co-filed herewith and incorporated herein by reference.

The hermetically sealed container 11 of the present invention comprises an optical fiber feedthrough 56 for hermetically sealing the optical fiber 23 as it enters container 11, and at least one electrical feedthrough 58 for an electrical lead or interface 59 through the wall of the container 11. Multiple electrical leads will typically pass into hermetic container 11 as described further below. The fiber feedthrough 56 is described further below with reference to FIG. 7.

FIG. 2A through FIG. 2C graphically illustrates the pass band relationship of the grid etalon 24, wedge etalon 26 and the external cavity defined by rear facet 18 and end mirror 14. FIGS. 2A–2C show the external cavity pass bands PB1, grid etalon pass bands PB2, and wedge etalon pass bands PB3. Relative gain is shown on the vertical axis and wavelength on the horizontal axis. As can be seen, free spectral range of the wedge etalon 26 ($FSR_{Channel\ Sel}$) is greater than the free spectral range of the grid etalon 24 ($FSR_{Grid\ Gen}$), which in turn is greater than the free spectral range of the external cavity ($FSR_{Cavity}$). The band pass peaks PB1 of the external cavity periodically align with the center wavelengths of pass bands PB2 defined by the wavelength grid of grid etalon 24. There is one pass band peak PB3 from the wedge etalon 26 which extends over all of the pass bands PB2 of the wavelength grid. In the specific example shown in FIGS. 2A–2C, the wavelength grid extends over sixty four channels spaced apart by one half nanometer (nm) or 62 GHz, with the shortest wavelength channel at 1532 nm, and the longest wavelength channel at 1563.5 nm.

The finesse of grid etalon 24 and wedge etalon 26 determine the attenuation of neighboring modes or channels. As noted above, finesse is equal to the free spectral range over the full width half maximum, or finesse=FSR/FWHM. The width for a grid etalon pass band 56 at half maximum is shown in FIG. 2B, and the width for a wedge etalon pass band 58 at half maximum is shown in FIG. 2C. The positioning of grid etalon 24 and wedge etalon 26 within the external cavity improves side mode suppression.

Figure 3A:
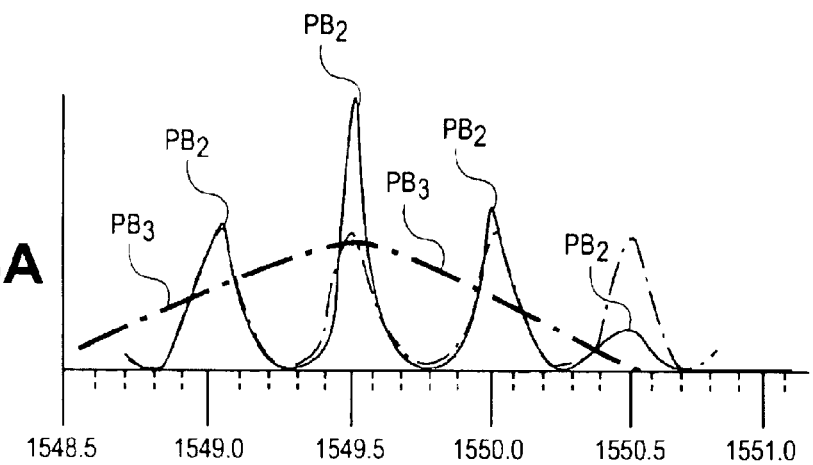
FIGS. 3A–3C are graphical illustrations of gain response to tuning of the external cavity laser of FIG. 1 for a plurality of channels in a wavelength grid.
Figure 3B:
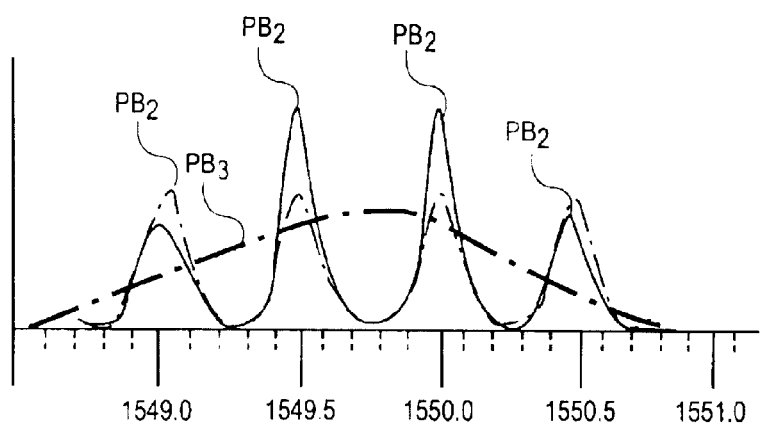
Figure 3C:
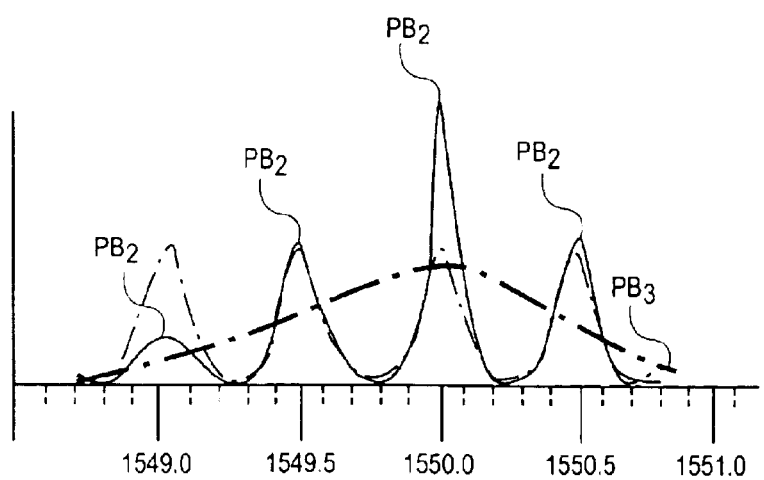

The tuning of the band pass PB3 of wedge etalon 26 between a channel centered at 1549.5 nm and an adjacent channel at 1550 nm is illustrated graphically in FIGS. 3A–3C, wherein the selection of a channel generated by grid etalon 24 and the attenuation of adjacent channels or modes is shown. The external cavity pass bands PB1 shown in FIGS. 2A–2C are omitted from FIGS. 3A–3C for clarity. The grid etalon 24 selects periodic longitudinal modes of the external cavity corresponding to the grid channel spacing while rejecting neighboring modes. The wedge etalon 26 selects a particular channel in the wavelength grid and rejects all other channels. The selected channel or lasing mode is stationary at one particular channel for filter offsets in the range of approximately plus or minus one half channel spacing. For larger channel offsets the lasing mode jumps to the next adjacent channel.

In FIG. 3A, the wedge etalon pass band PB3 is centered with respect to the grid channel at 1549.5 nm. The relative gain associated with pass band PB2 at 1549.5 nm is high, while the relative gain levels associated with adjacent pass bands PB2 at 1549.0 nm and 1550.0 nm are suppressed relative to the selected 1549.5 nm channel. The gain associated with pass bands PB2 at 1550.5 nm and 1548.5 nm is further suppressed. The dashed line indicates the relative gain for pass bands PB2 without suppression by wedge etalon 26.

FIG. 3B shows the wedge etalon pass band PB at a position in between the channels at 1549.5 nm and 1550.0 nm, as occurs during channel switching. The relative gain associated with pass bands PB2 at 1549.5 nm and 1550.0 are both high, with neither channel suppressed. The relative gain levels associated with pass bands PB2 at 1549.0 nm and 1550.5 nm are suppressed relative to the 1549.5 nm and 1550.0 nm channels. The dashed line indicates the relative gain for pass bands PB2 without suppression by wedge etalon 26.

FIG. 3C shows the wedge etalon pass band PB3 centered with respect to the grid channel at 1550.0 nm, with the relative gain associated with the pass band PB2 at 1550.0 nm being high, while the relative gain levels associated with adjacent pass bands PB2 at 1549.5 nm and 1550.5 nm are suppressed relative to the selected 1550.0 nm channel, and the gain associated with pass bands PB2 at 1551.0 nm and 1549.0 nm is further suppressed. Again, the dashed line indicates the relative gain for pass bands PB2 without suppression by wedge etalon 26.

Figure 4:
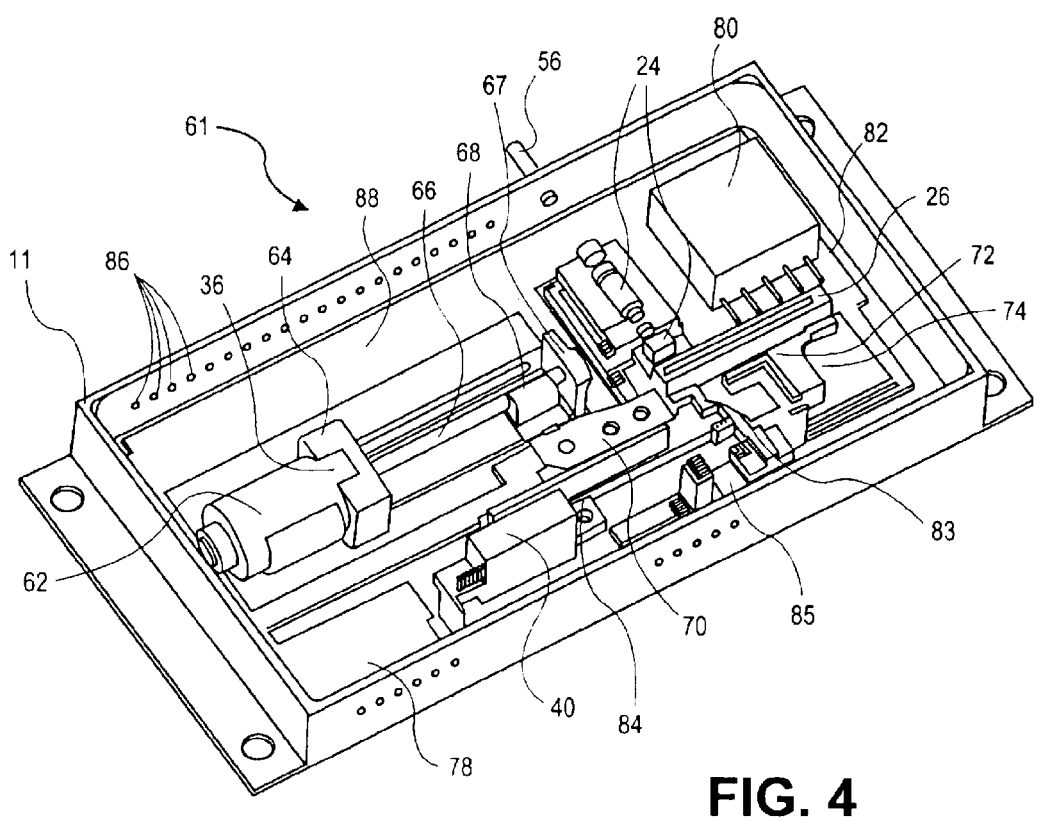
FIG. 4 is a perspective view of an external cavity laser in a hermetically sealable enclosure, shown with the cover removed.
Figure 5:
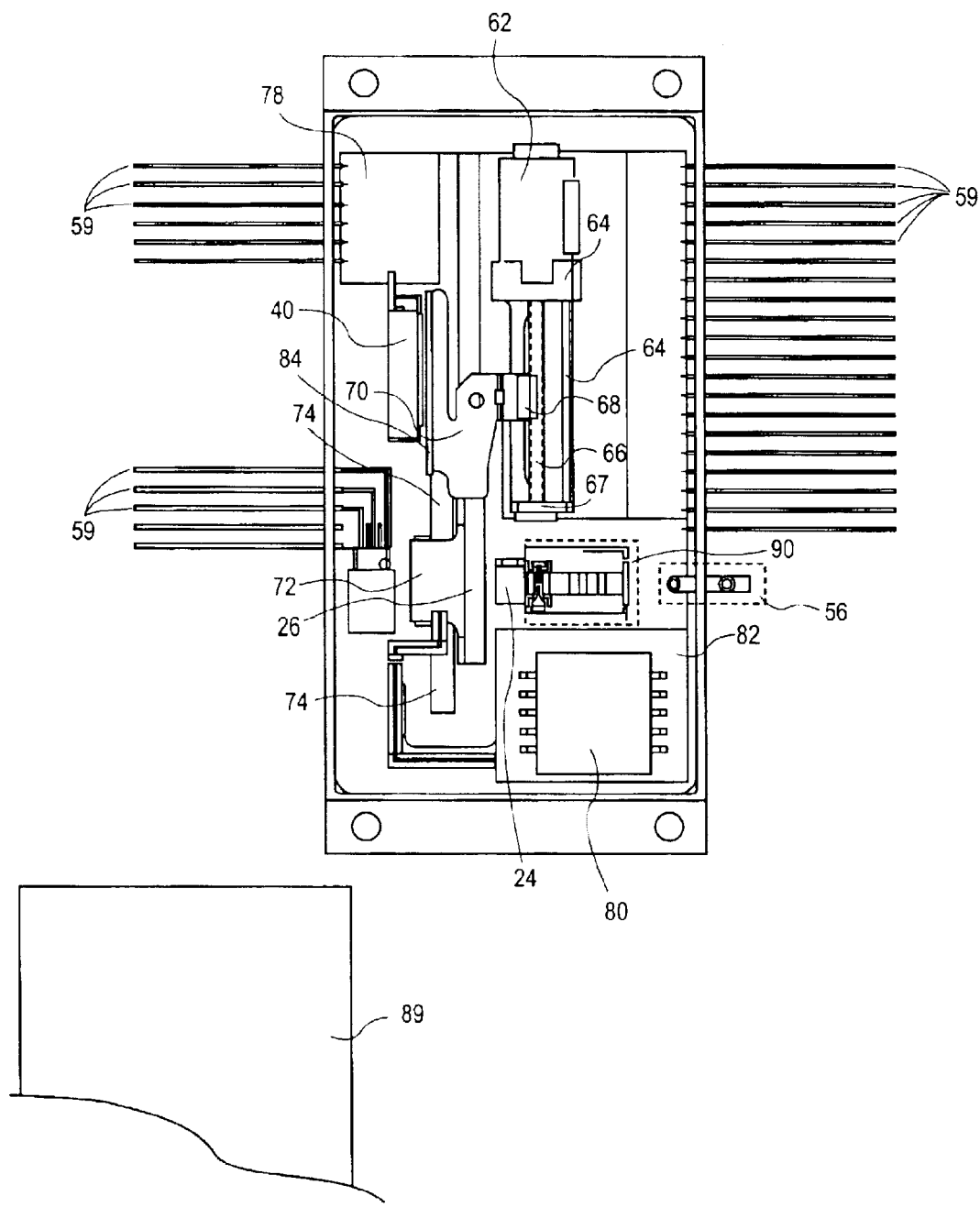
FIG. 5 is a top plan view of the external cavity laser and hermetically sealable enclosure of FIG. 4, with the end mirror omitted.

In order to provide accurate tuning of external cavity laser 10 in the manner shown in FIGS. 3A–3C and described above, a variety of components are required which have high outgassing characteristics during laser operation, such that volatile organic compounds and moisture may evolve from the components which can contaminate the various optical surfaces of the external cavity laser 10. FIG. 4 and FIG. 5 show another embodiment of a hermetically enclosed external cavity laser apparatus 61 that more clearly shows the various components associated with high outgassing within a hermetically sealed enclosure. Like reference numbers are used to denote like parts. Electrical leads 59 are omitted from FIG. 5 for clarity. Container 11 also includes a hermetically sealable lid which is omitted for clarity.

In the external cavity laser apparatus 61 depicted in FIGS. 4 and 5, drive element 36 is provided in the form of a stepper motor 62 structured and configured to adjustably position wedge etalon 26 according to selected channels. Stepper motor is mounted in a motor bracket 64 and turns a threaded shaft 66 mounted in bearing 67. Threaded shaft 66 drives a threaded half nut 68 that is coupled to the wedge etalon 26 by bracket 70. Drive element 36 may alternatively comprise various types of actuators, including, but not limited to, DC servomotors, solenoids, voice coil actuators, piezoelectric actuators, ultrasonic drivers, shape memory devices, and like actuators (not shown). Drive element 36 is configured for minimal outgassing during operation of the apparatus 61 by minimizing the use of lubricants and using low friction, low outgassing materials such as DELRIN® nylon for parts such as half nut 68. Internal conductors (not shown) in motor 62 are kept as short in length as possible to minimize the area of insulator surface present inside container 11.

Half nut 68 is coupled to a bracket 70 which in turn is coupled to a stage 72. Stage 72 supports wedge etalon 26 and slidably moves along a rail 74 to allow positioning of wedge etalon 26. As shaft 66 is turned by stepper motor 62, half nut 67 is moved along shaft 66 by the threaded interaction therebetween. The movement of half nut 68 drives bracket 70 and stage 72 along rail to position wedge etalon 26.

A ceramic board 78 is soldered to container 11 to support an EEPROM chip (not shown) which may serve as a controller for the translation of wedge etalon 26 via stepper motor 62. The controller may alternatively be external to container, as noted above. A transformer 80 is supported on ceramic board 82 to provide power to a phase modulator 83 (FIG. 4) coupled to the laser end mirror (not shown). Linear encoder 40 is mounted to container 11 adjacent an encoder scale 84 and is used to monitor the positioning of wedge etalon 26. A photodetector 85 (FIG. 4) is positioned in the laser optical path behind phase modulator 83 and is used to monitor laser performance.

Encoder 84 and transformer 80, like stepper motor 62, are engineered and configured for minimal outgassing within hermetic container 11 during laser operation. In this regard, insulator materials in encoder 84 and transformer 80, as well as elsewhere within hermetic container are minimized and are selected for low outgassing characteristics.

Holes 86 (FIG. 4) are provided in container 11 to allow hermetic sealing of electrical leads 59 extending therethrough by use of electric feedthroughs 58 (FIG. 1). Feedthroughs 58 comprise glass sleeves that fit into holes 86 and through which leads 59 fit. Feedthroughs 58 and leads 59 are hermetically fused into holes 86 by exposure to elevated temperature. The hermetic sealing of leads in this manner is carried out prior to inclusion of any heat sensitive components within container 11.

The hermetically sealable enclosure 11 is metal plated to prevent rust or corrosion from arising after sealing the external cavity laser 61 within enclosure 11. The hermetically sealed enclosure 11 may be made of KOVAR® Ni—Fe—Co alloy or other metal or metal alloy having good corrosion resistance and formability suitable for hermetic enclosures. Hermetic enclosure 11 is plated with gold or other corrosion-resistant metal or metal alloy to provide clean, corrosion-resistant surfaces. The enclosure 11 is metal plated under conditions that safeguard against possible contamination, such as class 100 or higher clean room conditions. Where possible, the use of adhesives is avoided within hermetic container 11 and fluxless solders are utilized for bonding. Circuit boards 88, 82 and 78 are made of ceramic instead of fiberglass-reinforced resin (to avoid outgassing associated with resin-containing boards), and are attached directly to the container 11 by a fluxless solder process. Lid 89 (only a portion of the lid is shown in FIG. 5) conforms generally to the shape of container 11, and includes a Ni—Au plating to allow for hermetic sealing to container 11 to form a hermetically sealed enclosure about the laser apparatus 61 therewithin.

Figure 6:
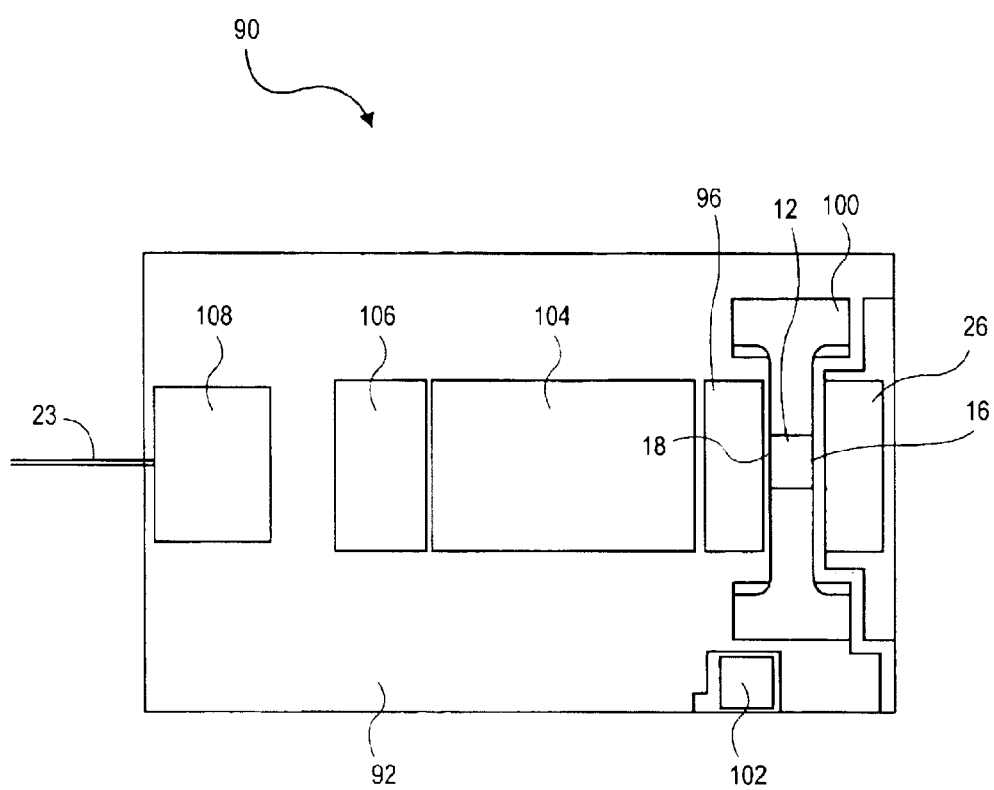
FIG. 6 is a schematic view of a laser sub-assembly of the hermetically sealable external cavity laser of FIG. 5.

Many of the important optical surfaces of the apparatus 61 may be located on a distinct or separate temperature controlled substrate in a laser sub-assembly module 90. FIG. 6 is a schematic view of the laser sub-assembly 90 of FIG. 5. The sub-assembly module 90 allows for the placement of laser output elements on a substrate 92, which is distinct and separate from the substrate or substrates supporting the other external cavity laser components. Subassembly 90 comprises a diode emitter chip 12 with output facets 16, 18 with collimator lenses 20, 96 optically coupled to facets 16, 18 respectively, a dog bone assembly 100, a thermistor 102, an optical isolator 104, a fiber focus lens 106 and a fiber ferrule 108, mounted on the laser output sub-assembly substrate 92.

The substrate 92 of the output sub-assembly 90 is bonded to a thermoelectric controller (not shown) which monitors the temperature of substrate 92 via thermistor 102 and provides thermal control of substrate 92 and the output sub-assembly components thereon. Diode facets 16 and 18, as well as the surfaces of collimators 20, 96 and 106 present several of the more important optical surfaces of the laser apparatus 61, and the inclusion of all of these components onto a single thermally controlled substrate 92 allows collective temperature control of the components to prevent condensation of moisture or outgassed volatile organic compounds on the optical surfaces.

Substrate 92 may comprise a material of high thermal conductivity such as aluminum nitride and/or silicon carbide. The thermally controlled subassembly 90 also allows the use of temperature control to maintain the optimum alignment of the components on substrate 90. In this regard, the substrate 92 may be matched in CTE (coefficient of thermal expansion) to that of diode emitter 12. The use of thermal control on selected optical components as provided by subassembly 90 also minimizes the power requirements of the apparatus 61 by selectively heating only important optical components and optical surfaces.

Various other optical components may be subject to selective thermal control by mounting onto substrate 92 or onto other thermally controlled substrates (not shown). For example, grid generator 24 and/or a coarse spectrometer (not shown) may be positioned on substrate 92. Selective thermal control of optical components in an external cavity laser is also described in U.S. patent application Ser. No. 09/900,429 entitled "External Cavity Laser with Selective Thermal Control" to inventors Daiber et al., co-filed herewith and incorporated herein by reference.

Figure 7:
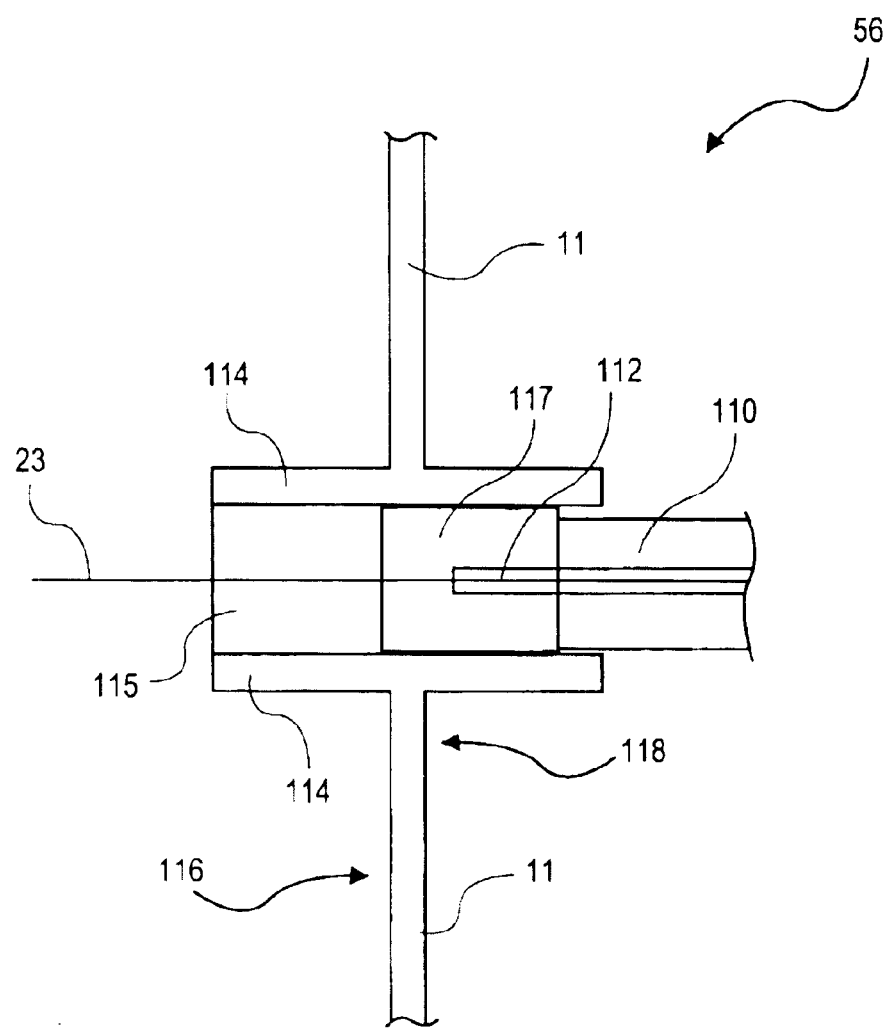
FIG. 7 is a schematic view of the optical fiber feed through of the hermetically sealable external cavity laser of FIG. 5.

Hermetic sealing is provided in association with optical fiber 23 by fiber feedthrough assembly 56, which is shown schematically in FIG. 7. The fiber feedthrough 56 is configured to hermetically seal the optical fiber 23. The outer 110 jacket and inner jacket 112 of the optical fiber 23 are removed from the portion of the fiber 23 which extends into enclosure 11 to avoid outgassing from the insulation material of the inner 112 and outer 110 jackets. A ferrule 114 extends through the wall of container 11, with fiber 23 extending through ferrule 114. On the inner side 115 of container 11, fiber 23 (from which jackets 110, 112 have been removed) is hermetically fused in place by a solder plug 116. The optical fiber 23 and inner surface of ferrule 114 may be metallized to facilitate soldering. An expoxy plug 117 holds fiber 23 in place adjacent the outer side 118 of container 11. The fiber feedthrough 56 is configured to provide pull stress support to fiber to prevent damage from handling.

In the fabrication of the hermetically sealed external cavity laser apparatus 61, the use of lubricants, adhesives, cable insulators and other materials which contain volatile compounds and residual moisture is minimized to limit material outgassing. Elements of the hermetically sealed laser 61 which are the most prone to outgassing include stepper motor 62, encoder 40, and transformer 80, and material selection to avoid outgassing is carried out where possible. Preparation and assembly of the various components of the apparatus 61 may be carried out under clean room conditions, and one or more cycles of vacuum baking, and/or or baking under inert atmosphere may be carried out to remove residual moisture and volatile organic hydrocarbons from the various components prior to hermetically sealing the enclosure 61 around the external cavity laser. In particular, one or more cycles of vacuum baking, followed by purging with inert atmosphere, may be carried out on the entire assembly for the apparatus 61, including the hermetically sealable lid 89.

Following the final vacuum baking/inert atmosphere purge cycle, the lid is hermetically sealed onto the enclosure in the presence of an inert, moisture-controlled atmosphere such that all components within the enclosure are hermetically sealed within. Moisture control provides a dry inert gas for container 11, and ensures minimal inclusion of moisture within container 11 after sealing. Numerous methods for hermetically sealing lids to containers are known in the art and may be used. The inert atmosphere used for hermetic sealing may comprise nitrogen, argon, helium, krypton, xenon or other inert gas, or various mixtures thereof.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A apparatus, comprising:
   an external cavity laser having an external cavity and a laser source within the external cavity;
   a hermetically sealable container enclosing said external cavity laser in an inert atmosphere;
   an activated carbon drain positioned within said hermetically sealable container to absorb outgassing compounds; and
   a heat source thermally coupled to at least one of said laser source and said external cavity to maintain said at least one of said laser source and said external cavity at a first temperature above a second temperature of said activated carbon drain when said laser source is not powered to prevent contamination of said at least one of said laser source and said external cavity.

2. The apparatus of claim 1, further comprising a moisture trap to absorb moisture within said hermetically sealable container and wherein said heat source is further to maintain said at least one of said gain medium and said external cavity at said first temperature above a third temperature of said moisture trap when said gain medium is not powered to prevent condensation on said at least one of said gain medium and said external cavity.

3. The apparatus of claim 1, wherein said external cavity is tunable.

4. The apparatus of claim 3, wherein said laser source comprises a gain medium having first and second output facets, said second output facet having an anti-reflective coating thereon.

5. The apparatus of claim 4, wherein said external cavity laser further comprises an end mirror, said end mirror and said first output facet of said gain medium defining said external cavity, said gain medium to emit a beam from said second output facet along an output path.

6. The apparatus of claim 5, further comprising a tuning assembly operatively coupled to said end mirror and configured to adjust said end mirror, in said hermetically sealable container.

7. The apparatus of claim 3, wherein said external cavity laser further comprises a grid generator.

8. The apparatus of claim 3, further comprising an optical fiber extending into said hermetically sealable container and positioned to receive optical output from said external cavity laser, and a fiber feedthrough, configured to hermetically seal said optical fiber.

9. The apparatus of claim 1, wherein said external cavity laser further comprises a channel selector.

10. The apparatus of claim 9, further comprising a tuning assembly operatively coupled to said channel selector and configured to adjust said channel selector.

11. The apparatus of claim 1 wherein the activated carbon drain comprises a surface of carbon to absorb outgassing compounds that occur during operation of the laser source, the outgassing compounds including volatile organic compounds.

12. The apparatus of claim 1, further comprising a moisture trap positioned within said hermetically sealable container.

13. The apparatus of claim 1, wherein said inert atmosphere comprises a gas selected from nitrogen, helium, neon, argon, krypton, xenon, a nitrogen-helium mix, a neon-helium mix, a krypton-helium mix, or a xenon-helium mix.

14. The laser apparatus of claim 1, further comprising a sacrificial surface within said means for hermetically sealing, said sacrificial surface to be maintained at a temperature less than surrounding surfaces.

15. A laser apparatus, comprising:
(a) a gain medium including an active region and having first and second output facets;
(b) an end mirror, said first output facet of said gain medium and said end mirror defining an external cavity, said active region of said gain medium to emit a beam along an optical path in said external cavity, said end mirror positioned in said optical path;
(c) a hermetically sealed container enclosing said external cavity within an inert atmosphere;
(d) a moisture trap positioned within said hermetically sealed container to absorb moisture within said hermetically sealed container; and
(e) a heat source thermally coupled to at least one of said gain medium and said end mirror to maintain said at least one of said gain medium and said end mirror at a first temperature above a second temperature of said moisture trap when said gain medium is not powered to prevent condensation on said at least one of said gain medium and said end mirror.

16. The apparatus of claim 15, further comprising a tuning assembly operatively coupled to said end mirror and configured to adjust said end mirror, said tuning assembly located within said hermetically sealed container.

17. The apparatus of claim 15, wherein said external cavity laser further comprises a grid generator, said grid generator positioned in said optical path in said external cavity.

18. The apparatus of claim 15, further comprising a channel selector, said channel selector positioned in said optical path in said external cavity.

19. The apparatus of claim 18, further comprising a tuning assembly operatively coupled to said channel selector and configured to adjust said channel selector, said tuning assembly positioned within said hermetically sealed container.

20. The apparatus of claim 15, further comprising an activated carbon drain positioned within said hermetically sealed container.

21. The apparatus of claim 15, wherein said inert atmosphere is a gas selected from nitrogen, helium, neon, argon, krypton, xenon, a nitrogen-helium mix, a krypton-helium mix, or a xenon-helium mix.

22. A laser apparatus, comprising:
(a) an external cavity laser having an external cavity and a laser source within the external cavity;
(b) means for hermetically sealing said external cavity laser in an inert atmosphere;
(c) means for absorbing volatile organic compounds within said hermetically sealable container; and
(d) means for heating at least one of said laser source and said external cavity to a first temperature above a second temperature of said means for absorbing when said laser source is not powered to prevent contamination of said at least one of said laser source and said external cavity.

23. The apparatus of claim 22, further comprising means for trapping moisture from said inert atmosphere, and wherein said means for heating further comprises means for heat said at least one of said laser source and said external cavity to a first temperature above a third temperature of said means for trapping moisture when said laser source is not powered to prevent condensation on said at least one of said laser source and said external cavity.

24. The apparatus of claim 22, further comprising means for tuning said external cavity laser.

25. The apparatus of claim 22, further comprising means for tuning said external cavity laser.

26. A method, comprising:
generating an optical beam along an optical path with a laser source;
feeding back at least a portion of the optical beam having a selected wavelength to the laser source;
selecting the selected wavelength with optical elements of an external cavity, the laser source and external cavity enclosed in an inert atmosphere using a hermetically sealed container;
absorbing moisture within the hermetically sealed container with a moisture trap; and
heating at least one of the laser source and the optical elements to a first temperature above a second temperature of the moisture trap when the laser source is not powered to prevent condensation on the at least one of the laser source and the optical elements.

27. The method of claim 26, wherein the external cavity is defined by an end mirror and a facet on the laser source, the end mirror and the facet positioned in the optical path.

28. The method of claim 27, wherein the optical elements include at least one of the end mirror, a grid generator, and a channel selector positioned in the optical path.

29. The method of claim 26, further comprising:
absorbing outgassing compounds created within the hermetically sealed container with an activated carbon drain; and heating the at least one of the laser source and the optical elements to a first temperature above a third temperature of the activated carbon drain when the laser source is not powered to prevent contamination of the at least one of the laser source and the optical elements.

30. The method of claim 29, wherein absorbing outgassing compounds comprises absorbing volatile organic compounds with the activated carbon drain positioned within the hermetically sealed container.

31. The method of claim 26, wherein the inert atmosphere comprises a gas selected form nitrogen, helium, neon, argon, krypton, xenon, a nitrogen-helium mix, a neon-helium mix, a krypton-helium mix, or a xenon-helium mix.

32. The method of claim 26, further comprising directing the optical beam out of the hermetically sealed container with an optical fiber extending into the hermetically sealed container and positioned to receive the optical beam from the external cavity, the optical fiber being hermetically sealed with a fiber feedthrough.

* * * * *